Figure 1:
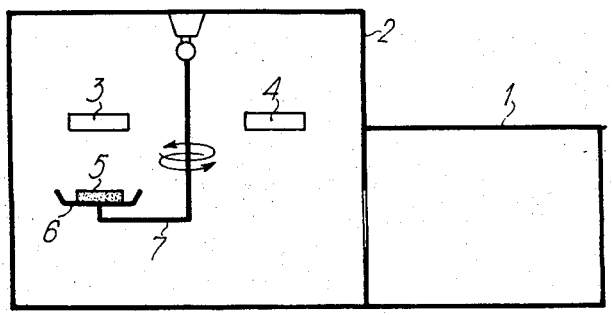

United States Patent [19]

Henry et al.

[11] 4,137,141

[45] Jan. 30, 1979

[54] PROCESS FOR PRODUCING A SILICON NITRIDE DIFFUSION BARRIER ON A SEMICONDUCTOR SUBSTRATE, PARTICULARLY III-V SEMICONDUCTOR SUBSTRATES

[76] Inventors: Loïc G. Henry, 16, Residence du Roux; Pierre N. Favennec, Crec'h Lia, Beg Leguer, both of 22300 Lannion, France

[21] Appl. No.: 850,951

[22] Filed: Nov. 14, 1977

[30] Foreign Application Priority Data

Nov. 18, 1976 [FR] France .............................. 76 35294

[51] Int. Cl.$^2$ .......................................... C23C 15/00
[52] U.S. Cl. ............................................... 204/192 EC
[58] Field of Search ......... 204/192 D, 192 E, 192 EC; 156/643

[56] References Cited

U.S. PATENT DOCUMENTS

| 3,591,477 | 7/1971 | Pomerantz | 204/164 |
| 3,600,218 | 8/1971 | Pennebaker | 117/93.1 GD |
| 3,849,276 | 11/1974 | Greiner | 204/192 |

FOREIGN PATENT DOCUMENTS

| 2148245 | 3/1973 | France. | |
| 2006276 | 8/1971 | Fed. Rep. of Germany | 204/192 D |
| 900,334 | 7/1962 | United Kingdom | 204/192 D |

OTHER PUBLICATIONS

C. S. Mogab et al., "Effect of Reactant Nitrogen Pressure on the Microstructure and Properties of Reactively Sputtered Silicon Nitride Films," vol. 122, *J. Electrochem. Soc.*, pp. 815-822 (1975).

S. M. Hu et al., "Silicon Nitride Films by Reactive Sputtering," *J. Electrochem. Soc.* vol. 114, pp. 826-833 (1967).

*Primary Examiner*—John H. Mack
*Assistant Examiner*—Aaron Weisstuch
*Attorney, Agent, or Firm*—Bierman & Bierman

[57] ABSTRACT

The process according to this invention makes it possible to produce a silicon nitride diffusion barrier on a semiconductor substrate, such as III-V semiconductor substrate and particularly a GaAs substrate, the produced diffusion barrier being efficient at temperatures as high as 900° C during a long period.

It comprises the following steps:
(a) chemical deoxidation of the substrate,
(b) thermal treatment at 400° C,
(c) 1st cathode sputtering step in a nitrogen atmosphere with a cathode made of silicon,
(d) ionic etching to reduce the thickness of nitride layer produced in c),
(e) 2nd cathode sputtering step similar to the first one.

It is useful for III-V semiconductors having to be treated at high temperature, as for instance to be annealed after ion implantation.

7 Claims, 1 Drawing Figure

PROCESS FOR PRODUCING A SILICON NITRIDE DIFFUSION BARRIER ON A SEMICONDUCTOR SUBSTRATE, PARTICULARLY III–V SEMICONDUCTOR SUBSTRATES

The present invention relates to a process for depositing a diffusion barrier or insulating film of silicon nitride on semiconductors, particularly III–V semiconductor compounds, such as gallium arsenide.

Gallium arsenide, a III–V semiconductor compound, is more and more utilized in electronic semiconductor components. However, when manufacturing those electronic components gallium arsenide has to be submitted to physiochemical processings to which it is very sensitive. Thus, before applying to a GaAs substrate a thermal processing above 50° C, the substrate surface needs to be protected by a diffusion barrier or insulating film. Indeed, as soon as the temperature rises arsenic easily evaporates and beyond 500° C GaAs may as a result therefrom to decomposed while craters are created at the substrate surface. A diffusion barrier is a stable protective layer precluding out-diffusion of elements from the protected material and avoiding any pollution of the protected material by impurities from outside.

By way of illustration, amongst thermal operations which a GaAS substrate may be submitted to, one can cite annealing operations over 500° C that are applied to the substrate after having submitted the substrate to an ion implantation operation. Practically, depending on the implanted ion and implantation operation conditions, annealing temperatures may rise as high as 900° C. Therefore it is necessary that the protective layer serving as a diffusion barrier can be deposited under 500° C and be efficient at temperatures at least as high as 900° C.

As a diffusion barrier, trials were made for utilizing silica that has already been very frequently used in techniques for the manufacture of numerous electronic components. However, silica has the major disadvantge of being very permeable as far as gallium is concerned. Moreover, silicon oxide and dioxide deposited at temperatures under 400° C poorly protect at higher temperatures.

Protective layers obtained by using anodic oxidation of the GaAs substrate were also studied. However, up to now the resulting oxide layer has proved to be non-resistant at temperatures over 600° C.

More and more, silicon nitride protective layers are being utilized in semiconductor technology, such silicon nitride layers being known as forming excellent masks against impurity diffusion and therefore against out-diffusion of arsenic and gallium. The most currently used method for depositing $Si_3N_4$ is the CVD (Chemical Vapor Deposition) process or pyrolytic process. Unfortunately in that case, deposition is performed at temperatures between approximately 750° C and 800° C, at which temperatures III–V compounds are already decomposed by evaporation.

It is also known to deposit a silicon nitride layer onto semiconductor surfaces by use of cathode sputtering with a cathode target made of silicon, an atmosphere containing nitrogen at a pressue of a few millitorrs, and an initial temperature equal to ambient temperature. However, when the semiconductor employed is GaAs, that simple cathode sputtering operation results in a $Si_3N_4$ layer that poorly adheres on GaAs and deteriorates at about 800° C.

A purpose of the present invention is to provide a process for manufacturing a diffusion barrier that does not have the hereabove mentioned drawbacks.

Another purpose of the present invention is to provide a process for manufacturing a silicon nitride diffusion barrier by use of cathode sputtering to deposit the silicon nitride, but making it possible to obtain good adhesion between the silicon nitride layer and the substrate, even when it is a GaAs substrate, and a silicon nitride layer that is not deteriorated at 800° C, but is still efficient at 900° C, as hereabove defined.

According to a feature of the present invention, there is provided such a process of manufacture that comprises the following steps:

(a) chemical treatment for deoxidizing the semiconductor substrate, (b) thermal treatment of the semiconductor substrate in an oven at about 400° C, (c) a first cathode sputtering step in a nitrogen atmosphere at a few millitorrs, the target cathode being made of silicon, to grow a first silicon nitride layer on the exposed surface of the semiconductor, (d) ionic etching of said first silicon nitride layer coating the front semiconductor substrate surface within a mixture of nitrogen and argon, to reduce by approximately half the thickness of said first silicon nitride layer, (e) a second cathode sputtering step substantially identical to the first cathode sputtering step to grow a second silicon nitride layer on the etched silicon nitride layer that together with such layer constitutes the desired diffusion barrier.

According to another feature of this invention, between the end of the first cathode sputtering step and the beginning of the ionic etching step, as well as between the end of the ionic etching step and the beginning of the second cathode sputtering step, the semiconductor substrate is allowed to cool.

Other features of this invention will appear more clearly from the following description of an embodiment, said description being particularly made in conjunction with the attached drawing involving a single figure that is a schematic view of an apparatus wherein steps c, d and e of the process according to this invention may be reduced to practice.

By way of example, treatment conditions and operation conditions involved in steps a–e according to this invention, as previously mentioned, may be the following ones, the substrate being a GaAs substrate.

(a) Chemical treatment for deoxidizing the semiconductor substrate

The GaAs substrate is etched with pure hydrofluoric acid during about 1 minute, then rinsed with filtered nonionized water, and finally dried in a filtered nitrogen atmosphere.

When the substrate is made of $GaP_xAs_{1-x}$, instead of GaAs, it is still possible to use in the same conditions pure hydrofluoric acid; on the contrary when the substrate is made of $GaIn_xAs_{1-x}$ and particularly $GaAl_xAs_{1-x}$, diluted hydrofluoric acid must be used.

(b) Thermal treatment

After step $a$ hereabove, the semiconductor substrate is heated in an oven at 400° C during about 20 minutes within a reductive atmosphere.

(c) First cathode sputtering step

As soon as it is removed from the oven utilized in step b, the GaAS substrate is placed in an evacuated cathode sputtering chamber. The target utilized for performing the desired sputtering is a cathode made of pure silicon under which the GaAs is located.

Sputtering conditions may be as follows:
distance from anode to cathode: about 5 cm
HF or RF power: 800 watts
pressure of nitrogen: $5-6 \times 10^{-3}$ torr
deposition duration: about 5 minutes
thickness of the produced silicon nitride layer: 800–900 angstroems.

It is to be noted that the adjustment of the nitrogen pressure at the above indicated value is fundamental for the quality of the deposit produced from the reaction silicon with nitrogen. Such an adjustment may be kept constant by maintaining a high pumping speed which implies a large nitrogen feed rate.

Once the cathode sputtering step is completed, the GaAs substrate is left to cool in the sputtering chamber for about 15 minutes in a nitrogen atmosphere. Such a cooling is intended to reduce the temperature of the substrate before subsequent treatment. Indeed, while sputtering is performed at ambient temperature, due to the temperature of the anode, the nitride deposit is hot and causes the temperature of the substrate to rise.

(d) Ionic etching

During the ionic etching step that preferably takes place in the sputtering chamber which has already been used for step c, the GaAs substrate is utilized as a cathode with its upper surface, that is coated with the silicon nitride layer, facing towards an anode.

Ionic etching conditions are as follows:
distance from anode to cathode: about 3.5 cm
HF or RF power: 300 watts
partial pressures of a nitrogen-argon mixture
nitrogen: $5 \times 10^{-3}$ torr
argon: $2 \times 10^{-3}$ torr
etching duration: about 5 minutes
thickness of removed silicon nitride: 400–500 angstroms A nitrogen-argon mixture is used in the etching chamber because the nitrogen ions are much lighter than the argon ions, which makes it possible to more easily control the etching speed.

Ionic etching is intended to reveal or broaden holes and defects exisiting in the first silicon nitride layer produced in the course of the first cathode sputtering step c, and which will provide for a better adhesion of the second silicon nitride layer that is deposited during the subsequent second cathode sputtering step e.

Once the ionic etching step is completed, the GaAs substrate is left to cool in the same chamber for about 15 minutes in a nitrogen atmosphere, for the same reasons as hereabove mentioned.

(e) Second cathode sputtering step

The second cathode sputtering step is performed under the same conditions as those mentioned in describing step c, taking into account that the initial silicon nitride layer thickness is about 400–500 angstroms and the final silicon nitride layer thickness is about 1,200 angstroms.

Once the second cathode sputtering step is completed, GaAs is again left to cool for about 15 minutes in a nitrogen atmosphere.

The single FIGURE is a schematic view of a conventional cathode sputtering apparatus which also makes it possible to perform the ionic etching step d. The apparatus comprises an input lock chamber 1 and an operating chamber 2 wherein there are provided several cathodes including a silicon deposition cathode 3 and a cathode 4 designed for the ionic etching step. Substrate 5 is placed in lock chamber 1 and carried on substrate table 6 secured to a J-arm 7 supporting substrate table 6 which is rotatable about a vertical axis integral with chamber 2. J-arm 7 may be rotated to sequentially set substrate 5 beneath cathode 3, then beneath cathode 4, and finally again beneath cathode 3. By way of example, the apparatus shown may be a sputtering apparatus commercially available from the American Company PERKIN-ELMER (Randex).

It has been found that a deposit of silicon nitride produced on a GaAs substrate according to the process of this invention makes it possible in further treatments to achieve substrate annealings at temperatures up to 950° C for 1 hour.
without alteration of the GaAs substrate surface,
but preserving the doping level that the substrate had before
deposition of the silicon nitride layer.

The silicon nitride layer thus produced may therefore be utilized in achieving defect annealings subsequent to ion implantations. It has been determined that such a silicon nitride layer is not permeable as far as diffusion of Ga and As are concerned, and adhesion thereof on the ion implanted substrate is highly reliable even as high as 950° C. Such a silicon nitride layer has permitted efficiencies of about 100% to be reached after ion implantation, particularly with sulfur and selenium, which indicates that silicon nitride layer is a good diffusion barrier and may be employed with any implanted impurity.

It is to be noted that the silicon nitride produced according to the process of this invention contains less than 1% of oxygen.

The silicon nitride layer according to this invention may also be utilized during ion implantation treatment even when it is performed with a hot substrate of about 400° C.

Furthermore, a silicon nitride layer according to this invention may also be used as a diffusion barrier when diffusing P-type impurities, such as Zn for instance, into III-V semiconductors, when manufacturing electronic devices, such as electroluminescent diodes, photodiodes, and so on.

Such silicon nitride layers may also be utilized on cleaved surfaces of III-V semiconductor laser diodes for increasing their lifetimes.

Further to be is that silicon nitride deposited according to this invention appears to be particularly suitable for complex semiconductors, such as GaInAs and GaAlAs which are very reactive and thus easily decomposed.

While the principles of the present invention have hereabove been described in relation with a specific embodiment, it must be clearly understood that the said description has only been made by way of example and not as a limitation to the scope of this invention.

What is claimed is:

1. A process for forming a silicon nitride diffusion barrier by cathode sputtering onto a dioxidized semiconductor substrate which has been preheated to approximately 400° C, which comprises the following steps, cathode sputtering in a nitrogen atmosphere with a silicon target to grow a first silicon nitride layer on the substrate, ionically etching the exposed surface of the silicon nitride layer in an atmosphere of nitrogen and argon until the first silicon nitride layer has been reduced by about one half, and cathode sputtering in a nitrogen atmosphere with a silicon target, a second silicon nitride layer upon the reduced silicon nitride layer to form the desired diffusion barrier.

2. A process according to claim 1, wherein between the end of the first cathode sputtering step and the beginning of the ionic etching step, and between the end of the ionic etching step and the beginning of the second sputtering step, the substrate is allowed to cool.

3. A process according to claim 2, in which the first and second cathode sputtering steps are performed with a cathode anode distance of approximately 5 cm, at a nitrogen pressure of $5\text{-}6 \times 10^{-3}$ torr, a power of about approximately 800 watts, and a flow of nitrogen sufficient for producing a silicon nitride layer 800–900 angstroms thick, at each sputtering step.

4. A process according to claim 1, in which the first and second cathode sputtering steps are performed with a cathode anode distance of approximately 5 cm, at a nitrogen pressure of $5\text{-}6 \times 10^{-3}$ torr, a power of about approximately 800 watts, and a flow of nitrogen sufficient for producing a silicon nitride layer 800–900 angstoms thick, at each sputtering step.

5. A process according to claim 1, in which the ionic etching step is performed with a cathode-anode distance of approximately 3.5 cm, power of approximately 300 watts, and under partial pressure of a mixture of nitrogen and argon of about $5 \times 10^{-3}$ torr for nitrogen and $2 \times 10^{-3}$ torr for argon.

6. Method according to claim 1, in which the semiconductor is a III–V semiconductor.

7. Method according to claim 6, in which the III–V semiconductor is GaAs.

* * * * *